United States Patent [19]

Courier de Méré

[11] 4,160,920

[45] Jul. 10, 1979

[54] BISTABLE ELEMENT AND A SWITCH CIRCUIT COMPRISING SUCH A BISTABLE ELEMENT

[75] Inventor: Henri Courier de Méré, Paris, France

[73] Assignee: Bicosa Societe de Recherches, France

[21] Appl. No.: 816,256

[22] Filed: Jul. 15, 1977

[30] Foreign Application Priority Data

Jul. 21, 1976 [FR] France .................. 76 22294

[51] Int. Cl.² ............................................. H03K 17/72
[52] U.S. Cl. ............................ 307/252 C; 307/252 H; 307/254
[58] Field of Search ................ 307/252 C, 252 H, 254

[56] References Cited

U.S. PATENT DOCUMENTS

| 3,504,197 | 3/1970 | Shibuya | 307/252 C |
| 3,614,474 | 10/1971 | Hahn | 307/252 C |
| 3,928,775 | 12/1975 | Steigerwald | 307/252 C |
| 3,940,633 | 2/1976 | Steigerwald | 307/252 C |

OTHER PUBLICATIONS

G.E. Scr. Manual, 2nd Edition Dec. 29, 1961, p. 72, Chap. 5.4 "Turn-Off Cicuits".

*Primary Examiner*—John S. Heyman
*Attorney, Agent, or Firm*—Robert E. Burns; Emmanuel J. Lobato; Bruce L. Adams

[57] ABSTRACT

A bistable device comprises a thyristor having anode, cathode and gate electrodes and a transistor having emitter, collector and base electrodes, the emitter-collector path of the transistor being connected to the anode-cathode path of the thyristor. A first control input is connected to the gate of the thyristor for determining one stable state of the device and a second control input is connected to the base electrode of the transistor for determining the other stable state of the device. The first control input is connected through an amplifier to the gate of the transistor.

8 Claims, 7 Drawing Figures

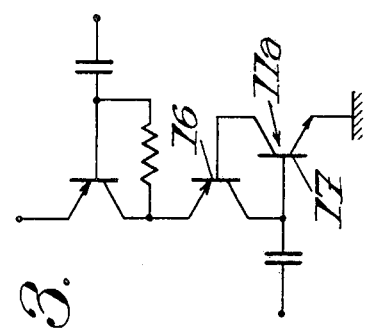
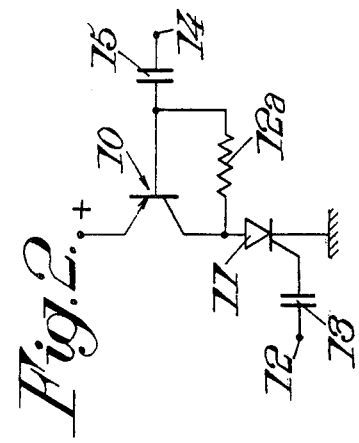
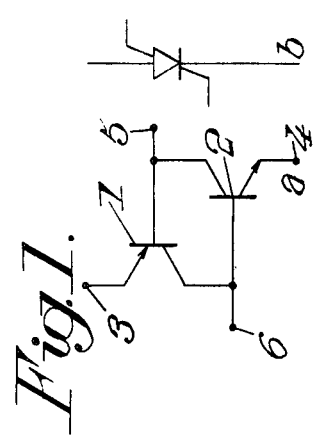

BISTABLE ELEMENT AND A SWITCH CIRCUIT COMPRISING SUCH A BISTABLE ELEMENT

The invention relates to improvements made to a bistable element and more particularly, relates to such an element which comprises a thyristor type member, a first state control input and a second state control input. It relates also to a circuit for switching the current supplied to a load which comprises such a bistable element.

FIG. 1 of the accompanying drawings illustrates the construction of a bistable element of the prior art, e.g. type BRY 39 manufactured by the firm "La Radio-technique"—Coprim—RTC". Such a known element comprises (FIG. 1a) two transistors 1 and 2, respectively of PNP and NPN type having electrodes: comprising an anode 3, a cathode 4, an anode gate 5 and a cathode gate 6. In general, this element is constructed in the form of an elementary integrated circuit in the "epitaxial planar" structure. FIG. 1b shows a symbolic representation of the bistable element in question.

The bistable element shown in FIG. 1 is placed in its enabled state in which it exhibits a low resistance between anode 3 and cathode 4 when a positive pulse is applied to the gate 6. This element remains in this first state even after the disappearance of the pulse on the gate 6. To stitch the bistable element to its disabled state in which it exhibits a high value resistance between anode 3 and cathode 4, a positive pulse is applied to the anode gate 5 and the bistable element remains in this second state even after the disappearance of the pulse at gate 5.

To obtain this second state it is necessary for the control pulse applied to input 5 to have an amplitude of a higher value than that of the source. This condition can be troublesome in certain applications, in particular, if the supply source for the bistable element is a low voltage battery; it is then necessary to provide a supplementary source to furnish the control pulses for the second state.

The invention has as its object, particularly, to remedy the above-mentioned disadvantage and to permit the construction of a bistable element in which the amplitude of the control pulses for shifting the element to the second state (disabled state) may be chosen from a wide range, the polarity of these pulses being able to be chosen at will at the time of designing said element.

The invention has also as its aim to replay better than up to now to the different desiderata of practice.

The bistable element of the invention is characterised in that it comprises a thyristor or similar type component and a transistor or similar type component. The control input for determining the first state of this element is connected to the gate electrode of the thyristor and the control input for determining the second state is connected to the base electrode of the transistor. The collector-emitter path of the transistor is disposed, in relation to the anode-cathode path of the thyristor, so that one of the two conduction states of the transistor results in the cancelling of the intensity of the current flowing through the thyristor; therefore, the second state of the bistable element corresponds to the disabled state of the thyristor.

In one embodiment of the invention the emitter-collector path of the transistor and the anode-cathode path of the thyristor are in series and, in this case, a biasing resistor is disposed between the base electrode and the collector electrode of the transistor.

In another embodiment the emitter-collector path of the transistor is disposed in parallel to the anode-cathode path of the thyristor and, preferably, a resistor is disposed in series with this parallel assembly of thyristor and transistor, the value of this resistor being chosen so that, in operation, when the thyristor is in the conducting state, the current which flows therethrough has an intensity which is only slightly higher than the intensity of the holding current in the conducting state of this thyristor.

The circuit for switching a current supplied to a load, in accordance with the invention, comprises a bistable element of the above-mentioned type. In the case where the emitter-collector path of the transistor and the anode-cathode path of the thyristor are disposed in series, it is advantageous that the load is also disposed in series with the thyristor and transistor. When the emitter-collector path of the transistor is disposed in parallel with the anode-cathode path of the thyristor, it is advantageous that the switch circuit comprises a conduction element controlled by the bistable element, the load being then disposed in series with this controlled conduction element.

It is advantageous that the control inputs for determining the first and second states of the bistable element of the switch circuit of the invention each comprise a first conducting contact and a second conducting contact associated with each of the first conducting contacts, these second contacts being connected to a determined potential point such as earth. Preferably, the distance separating the first conducting contact and the second corresponding conducting contact is less than the width of the end of a finger; it is then advantageous that the first or the second conducting contact is in the form of a ring surrounding the corresponding contact and being separated therefrom.

Other objects, characteristics and advantages of the invention will become more apparent from a reading of the description of certain of its embodiments, this description being made with reference to the accompanying drawings in which:

FIG. 1, already described, shows a bistable element of a known type,

FIG. 2 illustrates a bistable element according to the invention,

FIG. 3 shows a variation of the element shown in FIG. 2,

FIG. 4 shows a switch circuit, in accordance with the invention, this circuit comprising a bistable element of the kind shown in FIG. 2, FIG. 5 shows, on a larger scale, a variation of the conducting contacts of the circuit of FIG. 4, FIG. 6 shows another embodiment of the bistable element of the invention, and FIG. 7 shows a switch circuit comprising a bistable element of the type shown in FIG. 5.

The bistable element which is shown in FIG. 2 comprises a transistor 10, of PNP type, and a thyristor 11. The control input 12 for determining the first state is connected to the gate of thyristor 11, by means of a capacitor 13 for example. Control input 14 for determining the second state is connected to the base of transistor 10, also by means of a capacitor 15 in the example. The emitter of transistor 10 is connected to the positive pole (+) of a D.C. source (not shown), possibly through a load, not shown. The collector of transistor 10 is connected to the anode of the thyristor 11 and the cathode of this thyristor is connected to ground or the negative pole of the source. Thus, the emitter-collector path of transistor 10 and the anode-cathode path of thyristor 11 are disposed in series. Finally, a biasing resistor 12a is disposed between the base and the collector of transistor 10.

In operation, the assembly formed by transistor 10 and thyristor 11 is normally non-conductive. When a pulse with a positive polarity is applied to input 12 the thyristor 11 is triggered. Therefore, transistor 10 is also enabled owing to biasing resistor 12a. Thus, even after the disappearance of the positive pulse at input 12, the assembly of transistor 10 and thyristor 11 remains conductive, providing of course that the intensity of the current flowing through this assembly is not cancelled out. This conductive state represents a first stable state.

To switch the assembly to a second stable state, a pulse with positive polarity is applied to input 14. This pulse causes, at least momentarily, the disabling of transistor 10 and, for this reason, the intensity of the current flowing through thyristor 11 is cancelled out. The thyristor 11 then passes to the disabled state and remains therein. A second stable state has then been given to the assembly of transistor 10 and thyristor 11.

It will be noted here that the advantage of this circuit, in relation to bistable elements of the same general kind already known, is that the amplitude of the control pulse for switching to the second state can be chosen from a wide range.

The bistable element shown in FIG. 3 is similar to that shown in FIG. 2; the only difference between the two elements resides in the fact that thyristor 11 has been replaced by an assembly 11a of two transistors 16 and 17 of types PNP and NPN respectively; the base of transistor 16 is connected to the collector of transistor 17 and the collector of transistor 16 is connected to the base of transistor 17. Such an assembly 11a of two transistors is equivalent to a thyristor. In this case, the control input for determining the first state is connected to the base of transistor 17.

There will now be described with reference to FIG. 4 one application, in accordance with the invention, of a bistable element similar to that described with reference to FIG. 2.

In this application, the bistable element is used to form a switch circuit with opening (or on) and closing (or off) contacts or keys. In the example, a load 20 is disposed in series with the assembly comprised of a transistor 10b (of type NPN) and a thyristor 11b. The terminal of load 20 which is not connected to the anode of thyristor 11b is connected to the positive pole (+) of a D.C. source (not shown). The emitter of transistor 10b is connected to the negative pole (−) of the source. A resistor 12b is connected between the collector and base of transistor 10b and has a value of 10 MΩ.

The gate of thyristor 11b is connected to the negative pole through a resistor 21 having a value of 10 KΩ in this example. This gate is also connected to the collector of an amplifier transistor 22 of PNP type whose emitter is connected to the positive pole of the source.

The base of transistor 10b is connected to a conducting contact 23 constituting the control input for determining the second state. Close to this contact 23 is disposed a second conducting contact 24 which is connected to the negative pole of the source. The distance separating these conducting contacts 23 and 24 is less than the width of the end of the finger of an operator.

Thus, when an operator puts the end of a finger between keys 23 and 24, the surface of the end of his finger is simultaneously in contact with terminals 23 and 24.

Similarly the base of transistor 22 is connected to a conducting contact 25 near which is disposed as associated conducting contact 26 which is connected to the negative pole of the D.C. source. Like contacts 23 and 24, contacts 25 and 26 are separated by a distance less than the width of the end of a finger, for the same reason as for said contacts 23 and 24.

In operation, when the operator places the end of a finger on keys 25 and 26, the resistance presented by the surface of this finger is sufficient to enable transistor 22; therefore, the gate of thyristor 11b receives a signal of positive polarity and the bistable element composed of thyristor 11b and transistor 10b shifts over to the conducting state. Load 20 is then supplied with current from the source. To obtain this result it is sufficient for the operator to apply his finger temporarily to contacts 25 and 26 because the bistable element remains in the conductive state after the operator has removed his finger from the contacts.

To interrupt the current supply to load 10, the operator applies the end of a finger to contacts 23 and 24 so as to bring the bistable element to its second or disabled state. Here again the temporary application of the end of a finger is sufficient to ensure switching to the second state.

In the example of the switch circuit which has just been described, contacts 23 and 24 (as well as contacts 25 and 26) are in the form of separate circles. However, it may be advantageous, as shown in FIG. 5, to construct, on the one hand, one of these contacts—for example contact 23a connected to the base of the transistor of the bistable element—in the form of a conducting circle and, on the other hand, the associated contact 24a in the form of a ring concentric to the circle. Of course, in this case, an insulating ring 27 separates the circle 23a from ring 24a.

In the example shown in FIG. 5, circle 23a comprises an indication as to the function of the key; in this case it is the letter "A" corresponding to "arrêt" (off). Of course, starting contacts 25 and 26 can be formed in a similar way. As a variation, the indication relating to the function of the key can be inscribed on an insulating ring 27.

Moreover, it is not necessary that circle 23a and ring 24a are circular and/or concentric. As a variation these elements are not concentric and/or have an oval shape, in this case the distance separating the contacts is not constant which takes into account the variable widths of the ends of the fingers of the operators. It is also possible to construct the contact 23a in the form of segments forming a comb and all connected to the same potential, contact 24a having also the same shape and the "teeth" of the corresponding comb being disposed in the spaces separating the teeth of the comb constituting the contact 23a. In the example of the bistable element which has been described up to now with reference to FIGS. 2, 3 and 4, the emitter-collector path of the transistor was disposed in series with the anode-cathode path of the thyristor. In the embodiment of the bistable element according to the invention which will now be described with reference to FIG. 6, the emitter-collector path of transistor 30 is disposed in parallel with the anode-cathode path of thyristor 31. More exactly, in the example, the emitter of the transistor 30 of PNP type is connected to the anode of the thyristor 31 and the collector of the transistor 30 is connected to the negative pole of the source, like the cathode of thyristor 31. The anode of the thyristor 31—and also the emitter of transistor 30—are connected to the positive pole (+) of the D.C. source (not shown) by means of a resistor 32 and, possibly, a load, also not shown. The control input 33 for determining the first state is connected to the gate of the thyristor 31 whereas the control input 34 for determining the second state is connected to the base of the transistor 30.

In operation, the application of a pulse with positive polarity to the control input 33 brings the thyristor 31 to the conducting state the, transistor 30 remaining disabled for its base is in the air. To switch the bistable element to its second state, a pulse of negative or zero polarity is applied to the input 34. Therefore the transistor 30 passes momentarily to the conducting state and shunts the current supplied to the thyristor 31; this latter then passes to the disabled state since the intensity of the current which flows therethrough passes through zero value.

The bistable element shown in FIG. 6 has, in relation to that shown in FIG. 2, the disadvantage of requiring pulses of different polarities for controlling the two states. However, it is possible to replace the transistor 30 by a transistor of the NPN type; in this case pn will apply a positive pulse to the input 34 to enable or turn on the transistor. On the other hand, it has the advantage, in relation to the element shown in FIG. 2, of having a smaller number of junctions in series with the terminals of the supply source; for this reason it will be more advantageous to use the bistable element shown in FIG. 6 than that shown in FIG. 2 when the D.C. source is a low voltage battery (1.3 or 1.5 volts) and/or a battery whose voltage has dropped (e.g. because of prolonged use).

There will now be described with reference to FIG. 7 an example of application of the bistable element shown in FIG. 6. It is the same application as that shown in FIG. 4, i.e. the construction of a switch circuit.

In the circuit shown in FIG. 7, the input 33 is connected to the collector of a transistor 40 of PNP type whose emitter is connected to the positive pole of the source and whose base is connected through a resistor 42 to a conducting contact 41. With contact 41 is associated a conducting contact 44 in the same way as are associated contacts 25 and 26 (FIG. 4).

The load 20a is connected in the example, on the one side to the negative pole of the source and on the other to the collector of a transistor 45 of PNP type whose emitter is connected to the positive pole of the source. The base of the transistor 45 is connected to the anode of the thyristor 31 of the bistable element by means of a resistor 46.

Input 34 of the bistable element is connected to the emitter of a transistor 47 of PNP type whose collector is connected to earth or ground. The base of this transistor 47 is connected to a conducting contact 49 through a resistor 48. With the conducting contact 49 is associated a contact 50 connected to earth. Like contacts 23 and 24 (FIG. 4) these contacts 49 and 50 are separated by a distance less than the width of the end of the finger of an operator.

Finally, protection Zener diodes 51 and 52 are disposed between the positive pole of the source and, respectively, the conducting contacts 49 and 41.

In operation, the application of the end of the finger of the operator between contacts 41 and 44 causes the transistor 40 to be enabled (turned on) and, therefore, a positive polarity signal is applied to the input of the bistable element. Thyristor 31 is then enabled (turned on) and, therefore, so is the transistor 45. Load 20a is then supplied with current by the source. In order to interrupt the current flow in the load, the operator applies the end of a finger to the contacts 49 and 50, which enables the transistors 47 and 30. Therefore, the transistor 45 is disabled (turned off) and the load 20a is no longer supplied with D.C. current.

Since, in this example, the bistable element is not disposed in series with the load and is not then necessarily supplied with the same current, it is advantageous to reduce to the necessary minimum the value of the current flowing through the bistable element and particularly through the thyristor 31. For this purpose, the resistor 32 is chosen to have a value sufficiently high so that, when the bistable element is in its first state, the current flowing through this resistor and the thyristor 31 is only slightly greater than the holding current $i_H$ of the thyristor.

Whatever the embodiment of the bistable element of the invention may be, it can be constructed in the form of an elementary integrated circuit.

Besides being used for providing a switch circuit, the bistable element of the invention can be used for numerous applications. As an example there can be cited the construction of memories.

As is evident and as it results moreover already from what has gone before, the invention is not limited to those of its modes of application and embodiments which have been more specially considered; it covers, on the contrary, all variations thereof.

I claim:

1. A bistable device having a first state control input and a second state control input and exhibiting a first stable state of conductivity after a pulse has been applied to its first state control input, and exhibiting a second state of conductivity, different from the first, after a pulse has been applied to its second state control input, said device comprising: an element of the thristor type having anode, cathode and gate electrodes and an element of the transistor type having emitter, collector and base electrodes; a first control input connected to said gate electrode of the thyristor type element for determining a first stable state of conductivity of the device; a second control input connected to said base electrode of the transistor type element for determining a second stable state of conductivity, different from the first, of the device; said first and second control inputs comprising on and off control inputs of the device and each comprising a first conducting contact, a second conducting contact associated with said first conducting contact, and means connecting the second contacts to a predetermined potential point; means connecting the emitter-collector path of said transistor type element in relation to the anode-cathode path of said thyristor type element so that one of the two stable conductivity states of said transistor type element causes the intensity of current flowing through said thyristor type element to be cancelled, said second stable state of conductivity corresponding to the disabled state of said thyristor type element; and an amplifier element connected between said first control input and said gate electrode of said thyristor type element.

2. A bistable device according to claim 1, wherein said emitter-collector path of said transistor type element is connected in series with said anode-cathode path of said thyristor type element; and a biasing resistor connected between said collector electrode and said base electrode of said transistor type element.

3. A bistable device according to claim 1, wherein said emitter-collector path of said transistor type element is connected in parallel with said anode-cathode path of said thyristor type element.

4. A bistable element according to claim 3, further comprising a resistor connected in series with the assembly comprised of said transistor type element and said thyristor type element in parallel and whose resistance value is chosen so that, when said thyristor type element is enabled, said thyristor type element is supplied with a current whose intensity is slightly greater than the intensity of the holding current in the enabled state of said thyristor type element.

5. A switch device for switching the current supplied to a load, said switch device comprising a bistable device as set forth in claim 2; and a load connected in series with said tyhristor type element and said transistor type element.

6. A switch device for switching the current supplied to a load, said switch device comprising a load; a bistable device as set forth in claim 4; and a conduction element controlled by the state of conductivity of the bistable device and being connected in series with said load.

7. A switch device according to claim 1, wherein the distance separating said first conducting contact from said second corresponding conducting contact is small enough to be bridged by the width of the end of a finger of an operator.

8. A switch device according to claim 8, wherein one of said first and second conducting contacts is in the shape of a ring surrounding the corresponding other contact and being separated therefrom.

* * * * *